(12) United States Patent
Kebichi et al.

(10) Patent No.: US 6,671,843 B1
(45) Date of Patent: Dec. 30, 2003

(54) METHOD FOR PROVIDING USER DEFINABLE ALGORITHMS IN MEMORY BIST

(76) Inventors: Omar Kebichi, 28477 SW. Meadows Loop, Wilsonville, OR (US) 97070; Christopher John Hill, 14 Blenheim Close Valley Park, Chandlers Ford, Hampshire SO53 4LD (GB); Paul J. Reuter, 89 Rice Ave., Northboro, MA (US) 01532; Ian Alexander Burgess, 1956 NW. Everett St., Portland, OR (US) 97209

( * ) Notice: Subject to any disclaimer, the term of this patent is extended or adjusted under 35 U.S.C. 154(b) by 342 days.

(21) Appl. No.: 09/737,620

(22) Filed: Dec. 14, 2000

Related U.S. Application Data
(60) Provisional application No. 60/248,337, filed on Nov. 13, 2000.

(51) Int. Cl.$^7$ .............................................. G01R 31/28
(52) U.S. Cl. ........................................ 714/733; 716/1
(58) Field of Search ................................ 714/724–738, 714/718, 699, 30, 127; 716/1, 8, 10, 14, 16; 365/189.01, 200–201

(56) References Cited

U.S. PATENT DOCUMENTS 5,991,909 A * 11/1999 Rajski et al. ................ 714/729
2002/0166098 A1 * 11/2002 Chang et al. .................. 716/1

OTHER PUBLICATIONS

MBIST Architecht Reference Manual, V8.8_1.100, Sep. 2000, Chapter 1—Introduction.
MBIST Architect —Anatomy of the BIST Controller, published by Mentor Graphics Corporation, Apr. 1999.
MBIST Architect Reference Manual, V8.9_1.10, Defining the Model—DFT Library Modeling for Memories, Dec. 2000.
MBIST Architect—UDA Kernel Design, published by Mentor Graphics, Apr. 1999.
Burgess, "Test and Diagnosis of Embedded Memory Using BIST,"*EE–Evaluation Engineering*, Mar. 2000.
Mentor Graphics, "Built–In Self–Test Process Guide, Software Version 8.9_1.10," Dec. 2000.

* cited by examiner

*Primary Examiner*—Albert Decady
*Assistant Examiner*—Guy Lamarre
(74) *Attorney, Agent, or Firm*—Klarquist Sparkman LLP

(57) ABSTRACT

A method performed by a software design tool for providing an algorithm to a BIST controller that tests memory within a circuit. The method includes reading a description of a user defined test algorithm for a BIST controller, translating the description into an in-memory representation of the user defined algorithm, and reading a memory model selected by a user. The in-memory representation of the user-defined algorithm is associated with the selected memory model. From the association an HDL description of a BIST controller is generated. The HDL description is operable to apply the user defined algorithm to a memory corresponding to the selected memory model.

20 Claims, 7 Drawing Sheets load librarymylib.lib
add memory model ram16x16 ram27x10...
add mbist algorithm 1 march1, diagonal
add mbist algorithm 2 unique
run
save bist -verilog

FIG. 5

```
step wCheckerBoardUp;
        data checkerboard;
        addr min, max, up, 1;
        operation w;

step rCheckerBoardUp;
        data checkerboard;
        addr min, max, up, 1;
        operation r;

step wInvCheckerBoardUp;
        data invcheckerboard;
        addr min, max, up, 1;
        operation w;

step rInvCheckerBoardUp;
        data invcheckerboard;
        addr min, max, up, 1;
        operation r;

repetition checkerBoard;
        seed value
begin
        step wCheckerBoardUp;
        step rCheckerBoardUp;
        step wInvCheckerBoardUp;
        step rInvCheckerBoardUp;
end test checkerBoard;
        repetitioncheckerBoard;
```

FIG.6

METHOD FOR PROVIDING USER DEFINABLE ALGORITHMS IN MEMORY BIST

RELATED APPLICATION DATA

This application claims the benefit of U.S. Provisional Application No. 60/248,337, filed Nov. 13, 2000, which is hereby incorporated by reference.

TECHNICAL FIELD

This invention generally relates to built-in self testing of electronic circuits and, more particularly, to built-in self testing of memory circuits such as embedded memories within an integrated circuit, memories on a multichip module, or off-chip memories.

BACKGROUND

Many of today's integrated circuit (IC) designs are a complete system on a chip (SOC) that include a processor core, multiple embedded memories, logic, I/O ports and more. Embedded memories are the densest components within a SOC, accounting for up to 90% of the chip area. Memories are also the most sensitive to manufacturing process defects, making it essential to thoroughly test them in a SOC.

Built-in self-test (BIST) has become the method of choice for testing embedded memories. To use this method, one or more BIST controllers are inserted within the SOC during the chip's design using a software design tool. One such tool is MBIST Architect™, offered by the assignee. The chip is then fabricated with the added BIST controllers. During testing of the fabricated chip, a BIST controller is instructed to supply a series of patterns to the ports of an embedded memory. These patterns, also called test algorithms, typically include but are not limited to march type and checkerboard type patterns that cause a memory to produce deterministic output data. The output data can be directly compared with the input reference data from the controller. Alternatively, the output from the memory can be compressed and checked against a reference signature provided by the controller. In either case, the comparison generates a signal indicating that the memory passed or failed the test.

Present memory BIST design tools provide a user with a number of standard test algorithms for use in a BIST controller. The standard test algorithms, however, are general in nature. They are not necessarily optimal for a user's novel or proprietary memory design. Yet with present BIST design tools, a user cannot modify or add to the standard test algorithms provided by the tool to meet specific needs.

It would be advantageous to provide a user with the ability to define its own BIST controller test algorithms for memory. It would also be advantageous to provide a software design tool that can accept user defined algorithms.

SUMMARY

In accordance with the invention, a method for providing an algorithm to a BIST controller that tests memory within a circuit is disclosed. The method includes reading a description of a user defined test algorithm for a BIST controller and translating the description into an in-memory representation of the user defined algorithm. The method further includes reading a memory model selected by a user. The in-memory representation of the user-defined algorithm is associated with the selected memory model. An HDL description of a BIST controller is generated, operable to apply the user defined algorithm to a memory corresponding to the selected memory model.

In one aspect of the method, it may include generating an in-memory representation of a standard test algorithm contained within a software tool upon activation of the tool; and associating the in-memory representation of the standard algorithm with the selected memory model. In another aspect of the method, it may include, in a computer, providing user access to a description of a standard test algorithm; recording changes made by a user to a copy of the standard test algorithm description; and saving the changed copy as a user defined algorithm description.

Additionally, a method for building a standard test algorithm into a software tool that adds BIST controllers to circuits for testing memory therein is disclosed. The method includes reading a description of a standard test algorithm for a BIST controller; translating the description into an in-memory representation of the algorithm; and translating the in-memory representation of the algorithm into source code written in the language of the software tool. The algorithm source code is compiled with the tool source code, thereby producing a software tool with the test algorithm built therein.

Furthermore, a novel structure and arrangement for test algorithms is disclosed.

The foregoing and other aspects of the invention will become more apparent from the following detailed description of an exemplary embodiment that proceeds with reference to the following drawings.

BRIEF DESCRIPTION OF THE DRAWINGS

FIG. 5 is an exemplary listing of instructions to a software tool for performing the method of FIG. 4.

FIG. 6 is an example source code file of a test algorithm according to the invention.

DETAILED DESCRIPTION

The illustrative embodiment of the invention is an electronic design automation (EDA) software tool in the form of a computer program that is stored on a computer-readable medium and executed on a computer system. The computer system can be of any type capable of executing such computer programs and including computer-readable media for storing computer programs. Background information on EDA tools is provided in a number of works including M. Abramovici et al., *Digital Systems Testing and Testable Design*. Computer Science Press, 1990; by V. D. Agarwal et al., *Test Generation for VLSI Chips*. Computer Science Press, 1988; and J. Rajski et al., *Arithmetic Built-In-Self-Test for Embedded Systems*. Prentice-Hall, 1998.

Prior to the present invention, test algorithms available in a software tool for inserting memory BIST controllers into circuits were pre-coded into the tool. Adding a new algorithm required engineering work at the factory to extend the tool's behavior to support new algorithms. With the present invention, pre-coded test standard algorithms can be replaced or supplemented with user defined algorithms (UDAs). The standard algorithms are compiled into the software of the tool and available upon the tool's activation, while these user defined algorithms are typically loaded from stored files before or during the tool's execution.

The standard algorithms can use the same programming language as the user defined algorithms, and their source code is made available by the tool for viewing and copying by a user. The user can thus use a standard algorithm as a basis for creating a user defined algorithm by making modifications to a copy of a standard algorithm source file and then saving the results as a UDA.

Building in Standard Algorithms

Figure 1:
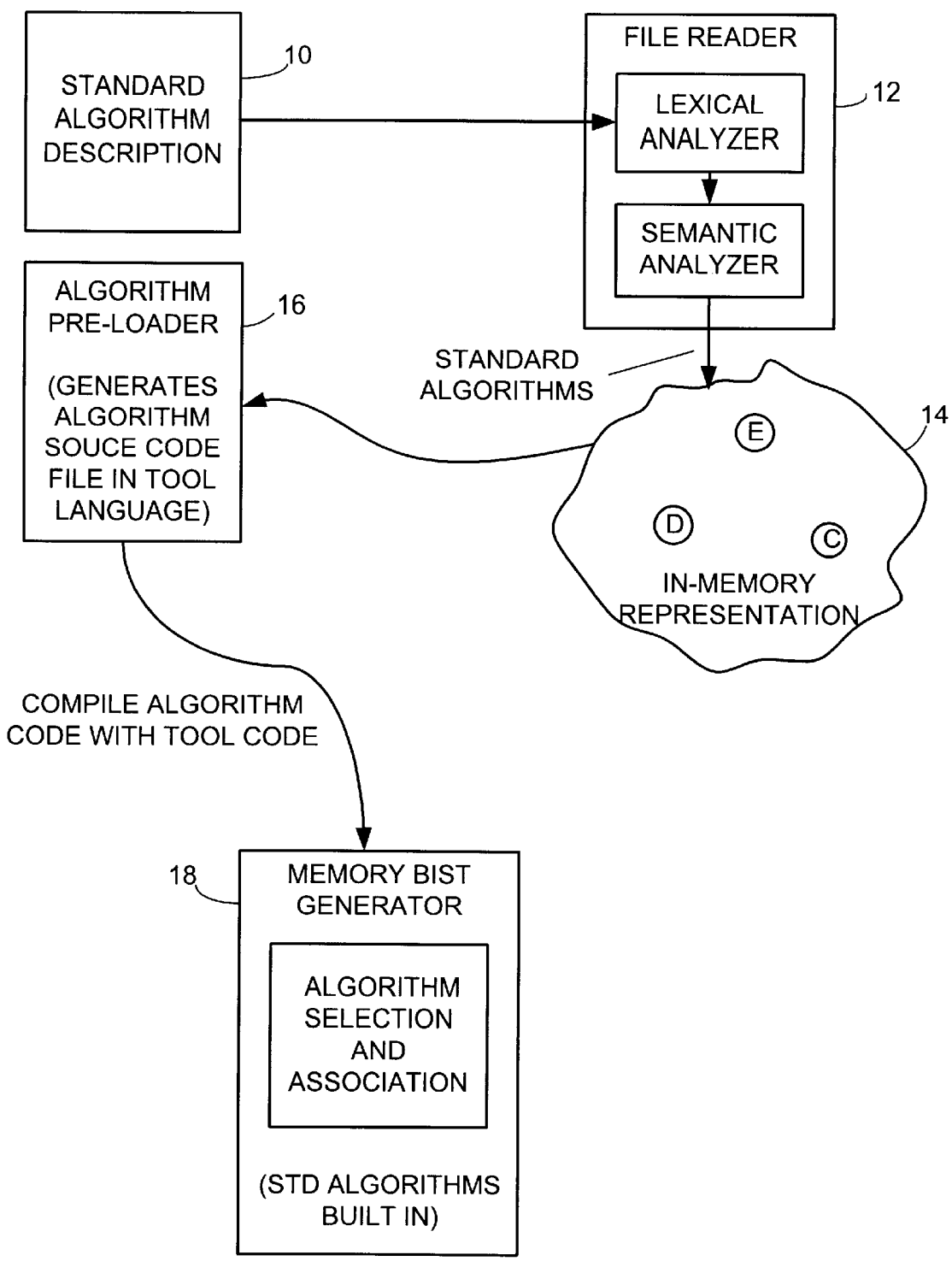
FIG. 1 is a block diagram of a structure for building standard test algorithms into a software design tool.

FIG. 1 is a block diagram of a structure for building standard test algorithms into a software design tool. (By "standard" is meant algorithms that are provided with the tool rather than algorithms defined by a user.) Prior to creating a version of the tool, a tool developer generates one or more standard algorithm descriptions in the form of a graphical model or a text file (block 10). The algorithm description is examined by a file reader for lexical and semantic correctness (block 12). Once a description passes these tests, it is translated into an in-memory representation of the algorithm, such as algorithms C, D, and E shown in memory (block 14). From an in-memory representation, an algorithm pre-loader generates algorithm source code files in the language of the tool, such as C++ (block 16). The algorithm source code files are then compiled with the source code of the tool, building the algorithms into the tool (block 18). These built-in algorithms have the advantage that, upon activation of the tool, in-memory representations of all of them are immediately generated. They can be selected by a user and be immediately available. If they were instead stored as files separate from the tool, there would be some delay upon their selection by a user in loading them into memory and creating their in-memory representation.

Figure 2:
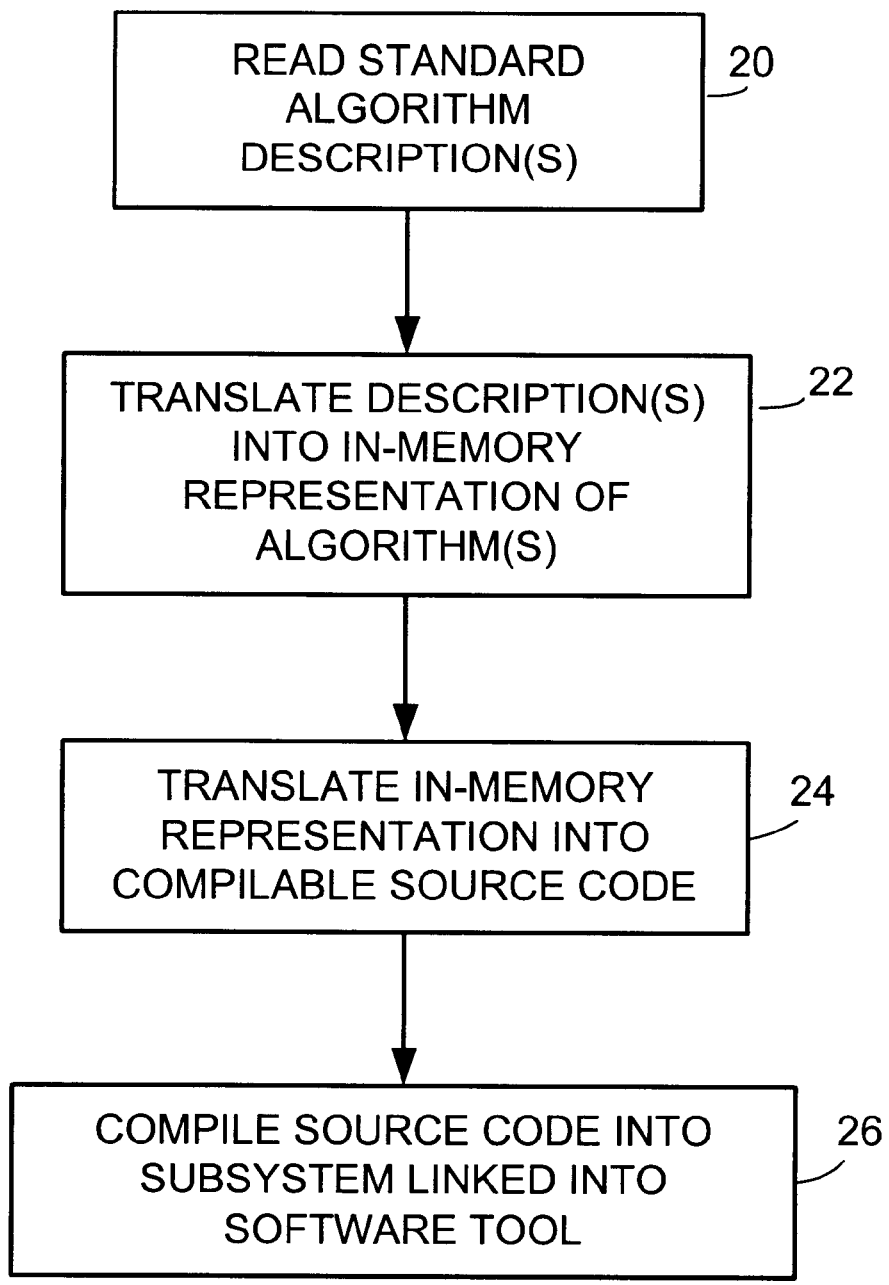
FIG. 2 is a flowchart of a method for building standard test algorithms into a software design tool.

FIG. 2 is a flowchart summarizing a method for building standard algorithms into a software tool such as the one illustrated in FIG. 1. Each standard algorithm description is read (20) and translated into an in-memory representation (22). The in-memory representation is then translated into source code compilable with the tool source code (24). The algorithm source code is then compiled with the source code of the tool to build the algorithms into the tool (26).

Creating UDAs

Figure 3:
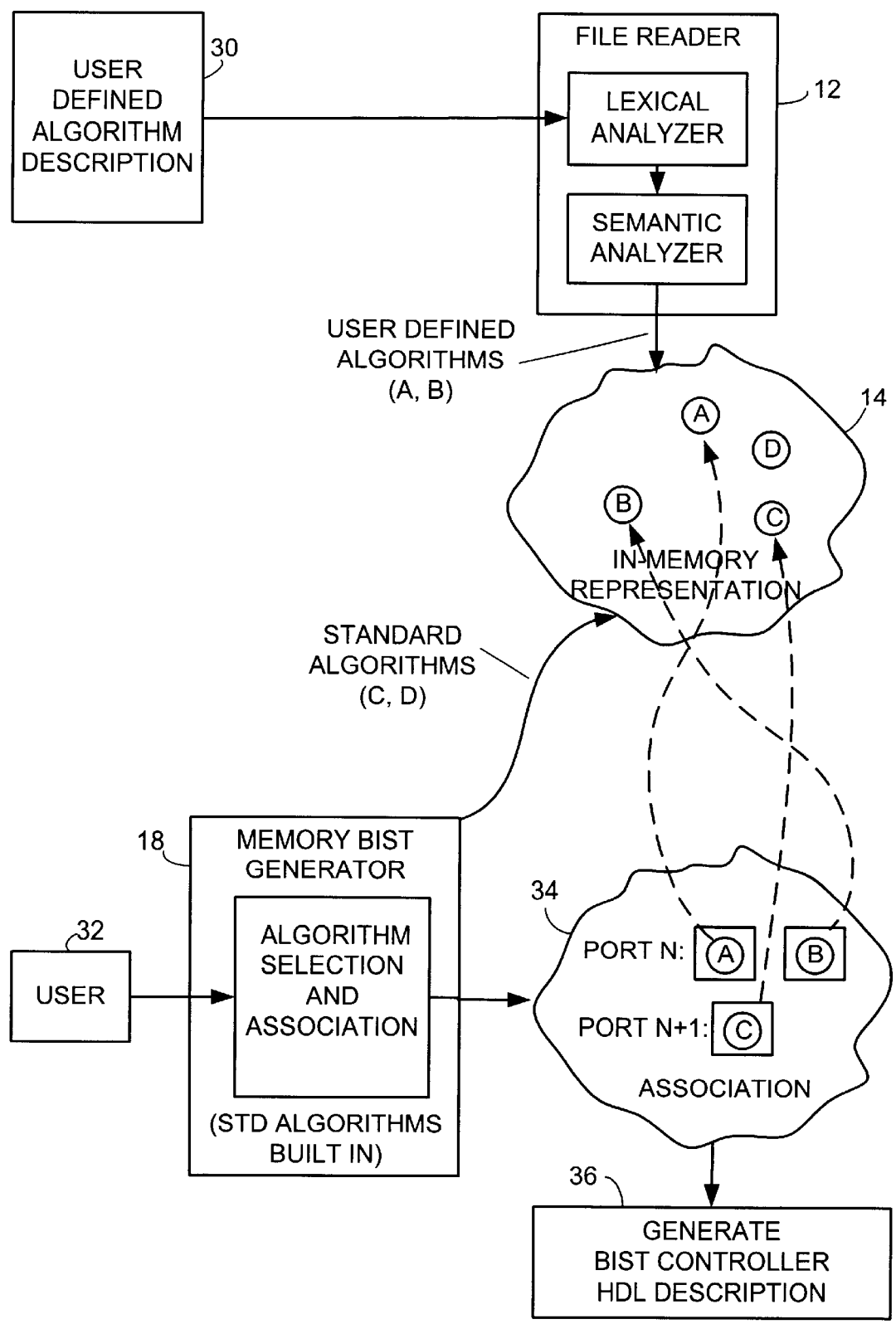
FIG. 3 is a block diagram of a software design tool that provides standard and user defined algorithms for BIST controllers that test memory within a circuit.

FIG. 3 is a block diagram of the software design tool of FIG. 1 as it is presented to a user by an active tool. The tool provides standard and user defined algorithms for BIST controllers that test memory within a circuit. A file reader 12 within the tool is operable to read a description of a user defined algorithm 30 supplied by the user in response to a user command. As with the standard algorithms, this description could be a graphical model, a text file, or other equivalents. The file reader translates the description of each user defined algorithm into in-memory representations such as representations A and B in memory 14. Note also in FIG. 3 that in-memory representations of standard algorithms C and D are present. Algorithm representations C and D come into being on activation of the tool. Representations A-D are then available within the tool 18 for selection by a user 32.

The tool responds to a selection by making the association 34 in memory and generating a BIST controller hardware description language HDL description 36. This HDL description is operable to apply the selected algorithms to a memory corresponding to the selected memory model. The HDL description may be at the transistor level, as a gate level net list, as register transfer logic (RTL), etc.

Figure 4:
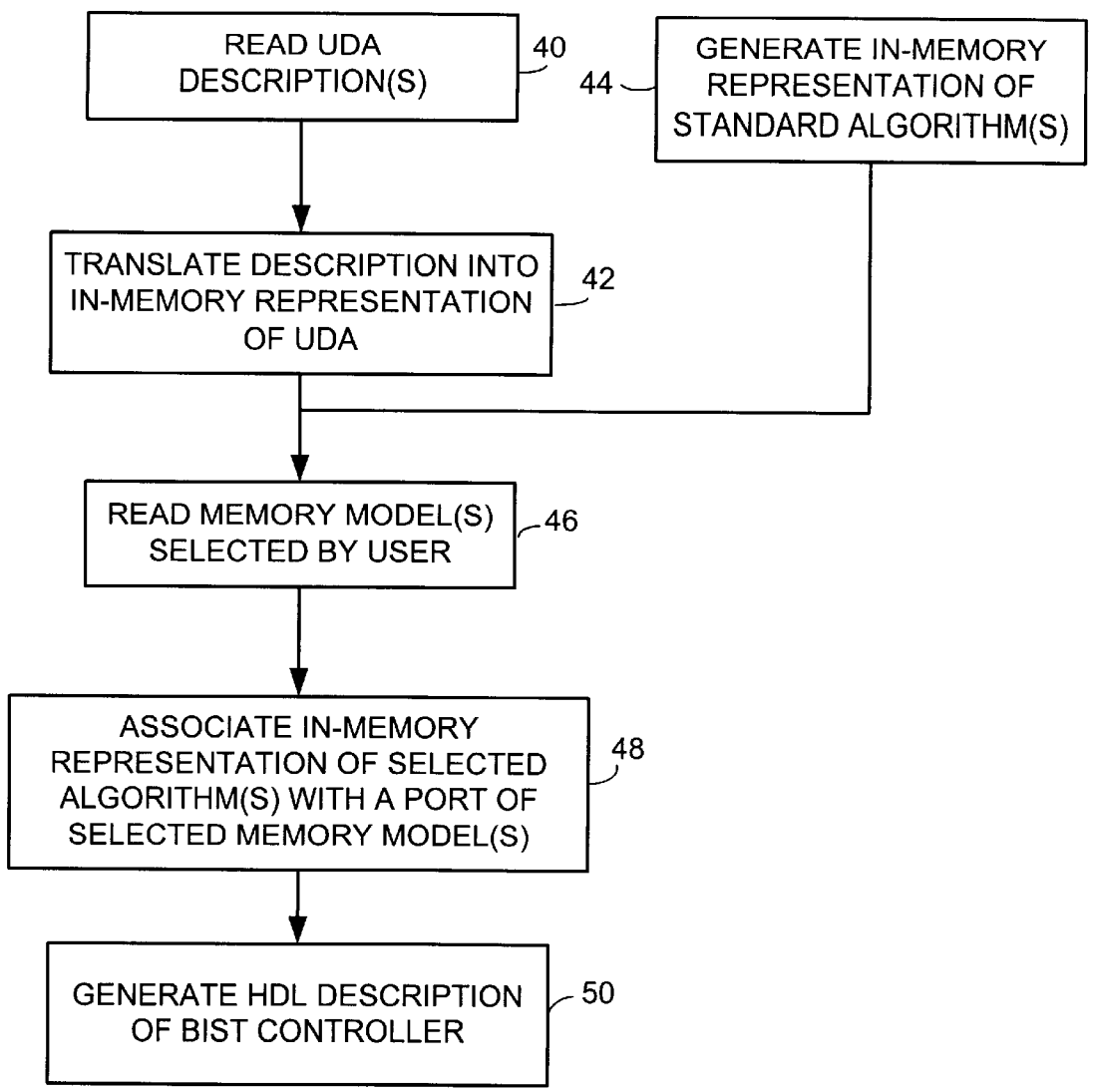
FIG. 4 is a flowchart of a method for providing standard and user defined algorithms to a BIST controller that tests memory within a circuit.

FIG. 4 is a flowchart of a method followed by a tool such as in FIG. 3 for providing standard and user defined algorithms to a memory BIST controller. It is best understood in conjunction with FIG. 5, which is an exemplary listing of user instructions to a software tool for performing the method of FIG. 4. In response to a user command such as "load algorithm file1, file2 . . . . " or other act, the tool reads one or more UDA descriptions (40) and translates each into an in memory representation (42). In contrast, in-memory representations of built-in standard algorithms are generated upon activation of the tool (44). The tool reads a list of memory models selected by a user such as "ram 16×16" from a library of memory models (46). The user through instructions such in FIG. 5 instructs the tool to associate certain algorithms with certain memory models (48). These algorithms can be standard or user defined. In FIG. 5, for example, algorithms "march1" and "diagonal" are associated with memory models that have a port 1. Algorithm "unique" is associated with memory models that have a port 2. Assume that memory model ram16×16 has two ports and that memory model 27×10 has only one port. With these instructions, then, all three algorithms are associated with memory model ram16×16 and only two algorithms are associated with memory model ram27×10. The tool is then run (50), which generates the BIST controller HDL description, and the description is saved.

It should be understood that the steps shown in FIG. 4 need not be taken in the sequence shown. For example, the user defined algorithms can be read and translated before or after memory models are selected.

Algorithm Structure Overview

The UDA capability allows a user to define algorithms using the same language with which the standard algorithms are defined. As noted above, the standard algorithms are built into the software during the software build process.

FIG. 6 shows an exemplary structure for a user defined algorithm, taken from a standard algorithm. Other structures may, of course, be used. The source code of the standard algorithms built within a tool is accessible to a user (although it cannot be changed). A user can make changes to a copy of a standard algorithm source file, and the tool will save the changed copy as a user defined algorithm description.

A test algorithm description constructed in accordance with the invention has certain structure and elements, as shown in the figure. A "test" element is the root of the algorithm description. It references a number of "repetitions." A repetition element aggregates a number of test algorithm activities using a common data seed value. It references a number of "steps." Steps form the body of a test algorithm. Each step performs a single pass across the address space of the memory performing a single activity at a variety of addresses. The order of elements in an algorithm definition file is declared before use. Multiple references may be made to different elements previously declared. All elements described in an algorithm definition file are locally scoped, except for algorithm definitions. It is quite permissible for multiple files to contain different definitions of a particular repetition or step. These elements will not clash and the one from the file will be used by all subsequent references in the file. However the globally scoped test algorithm definition may cause an already defined algorithm to be replaced.

The Test Element

More specifically, the test element forms the root of the algorithm. It gives the algorithm the name that it is known by. A test element references a number of repetitions that form the body of the algorithm. A test element, or declaration, has the following form:

test name;
  compress;
  compare;
preclude other_name;
begin
  repetition name;
  repetition name;
end The compare and compress clauses are optional and mutually exclusive. They inform the tool that the algorithm can only be used with a controller configured with a compressor or comparator respectively. The default if neither of these keywords is used is that the algorithm can be used in a BIST controller with either a compressor or comparator. The preclude clause names another algorithm that this algorithm is incompatible with. The tool generates an error message if the user tries to create a BIST controller that contains algorithms that preclude each other. The begin and end keywords surround the body of the algorithm declaration, a sequence of repetition references. If there is only a single repetition reference, then the begin and end keywords are unnecessary.

The Repetition Element

The repetition element forms an aggregation of the steps of an algorithm. Usually these steps share a common seed value, defined as part of the repetition. A repetition element, or declaration, has the following form:

repetition name;
  seed value;
  ld r1, source;
  ld r2, source;
begin step name;
  step name;
end The seed definition defines a common default seed value, to be used by all of the steps referenced from the repetition. The ld clauses are optional. If the data registers are used by the algorithm, then these clauses can be initialized by the repetition. The begin and end keywords surround the body of the repetition declaration, a sequence of step references. If there is only a single step reference then the begin and end keywords are unnecessary.

The Step Element

A step declares basic activity across the address space of the memory ports the algorithm is applied to. A typical step has the following form:

step name;
  addr end1, end2, direction, increment;
  data source;
  operation value;

The addr clause defines what happens to the address register during the step of the algorithm. It is this clause that defines the address sequence visited during the step of the algorithm. The data clause defines what data values will be used by the operation applied at each address of the address sequence visited by the algorithm step. The operation clause defines the activity that is performed at each address of the address sequence that is visited by the algorithm step.

Address Sequences

The addr clause of a step definition describes what address sequence will be used for the step. The exact sequence is controlled by the parameters of the clause The end1 and end2 values can be either an explicit numeric address or one of the symbolic values min or max, which correspond to the lowest and highest addresses that the BIST controller will be able to access. Together the end1 and end2 values define the bounds of the address sequence to be traversed. The direction value is either up or down, depending on the direction the address space is to be traversed. The last parameter incr defines the step size used to traverse the address space. This can be either a simple numeric value or the symbolic value jump.

Figure 7:
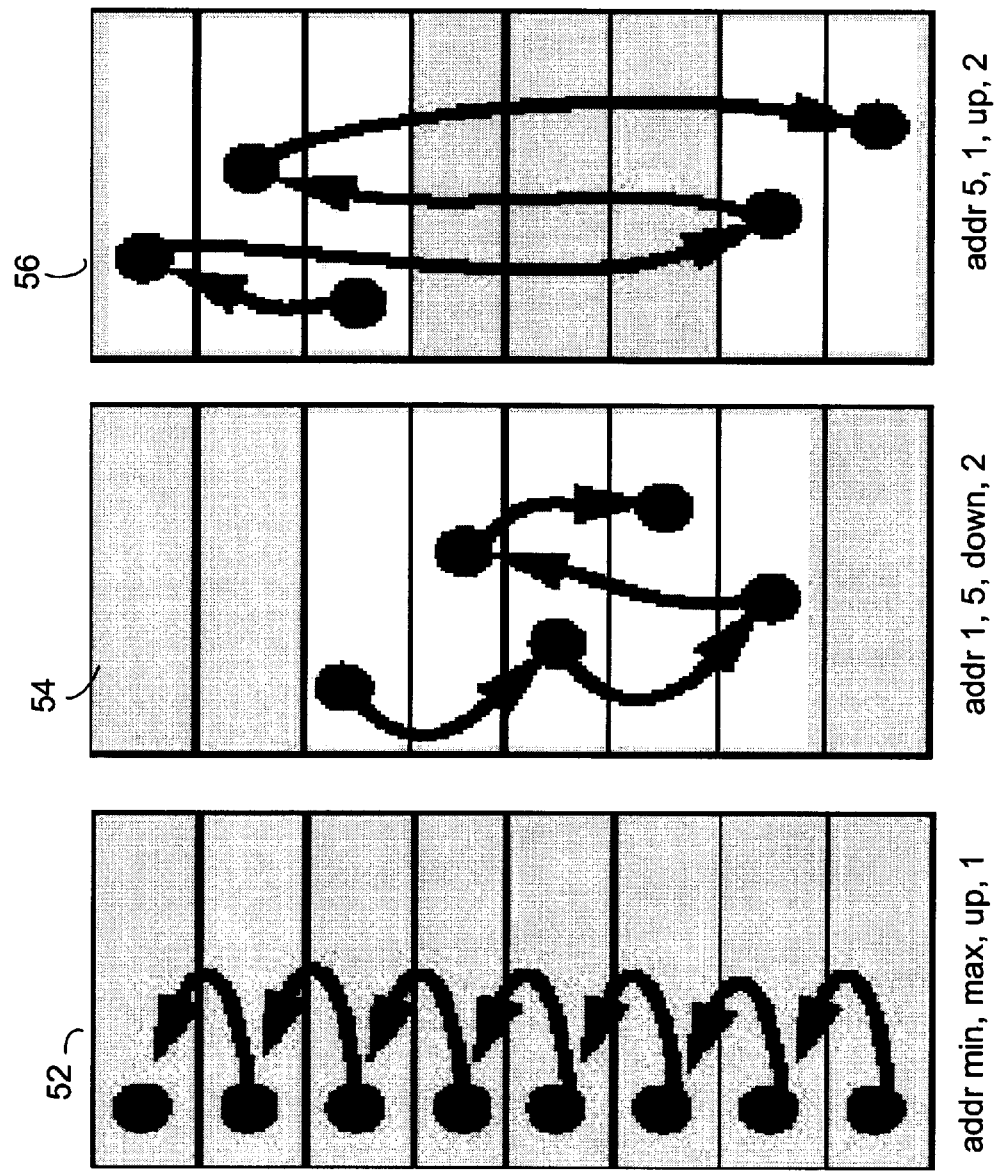
FIG. 7 is examples of address sequences that can be set by a test algorithm.

FIG. 7 shows an example of a number of address sequences. The first example 52 is a simple sequence across the entire address space of the memory, with an increment of one. The second example 54 is across a subset of the full address space of the memory, with an increment of two. The third example 56 has again an increment of two but across a different range of the address space.

When defining address sequences, a user should consider the HDL implementation impact for the address counter within the resultant BIST controller. The simplest form of address counter will be a simple increment, using a value of one or a power of two over a complete address range that is a power of two. Address sequences that contain a large number of discontinuities will require a larger address counter, to ensure the appropriate transitions are made at the discontinuities. When constructing the address counter implementation the down sequence is computed by taking the up sequence and reversing it. There are some complex, discontinuous, address sequences that have different sequences for up and down if the sequence was computed using the range and direction directly. When dealing with complex address range sequences the last value of the sequence will not necessarily be the last value of the address range.

Data Sources

The data clause of a step definition defines the type of data that will be used during the memory accesses of the step. The simple source values include the following:

Seed. The data seed value, obtained from the repetition referencing this step, is used. It is an error for the referencing repetition not to define a step.

Invseed. The inverse bit pattern of seed will be used.

Background. When data background values are defined, the tool instantiates the complete test algorithm once for each value. The current background value will be used as the data pattern. If no backgrounds are defined then the seed value from the referencing repetition is used.

Invbackground. The inverse bit pattern of background is used.

Checkerboard. A suitable checkerboard value will be used. The exact type and value depends on how the memory is modeled.

Invcheckerboard. The inverse of checkerboard data is used.

Addr. An address unique data value is computed and used. For memories that have more address bits than data bits this will be an additive reduction of the address bits. For memories that have more data bits than address bits this will be a catenation of the address.

Invaddr. The inverse of addr data is used.

When performing a memory access that performs multiple write activities the data pattern used will be inverted upon each write. If only a read is being done then the data expected is the data defined by the step. However, for more complex memory access operations, featuring a mixture of read and write activities, the data value expected to be read will be the value written by the last write activity. Except where the read occurs before the first write, in which case the data will be the inverse of the data that will be written by that first read. So, for example if the data is 'b0000 then a RWR operation will expect 'b1111, write b0000 and finally expect 'b0000. The WRWR operation will write 'b0000, expect 'b0000, write 'b1111 and expect 'b1111.

Operations

The operation clause of the step defines the memory access operation that is to be performed at each address of the address sequence to be used by the step. It is currently defined using a string of R and W characters to correspond to a read or write activity. So, a read write read activity will be represented as operation RWR. When the step is executed by the BIST controller the entire operation will be performed at each address of the address sequence, before the controller moves to the next address in the sequence.

Simple operations such as a single read or write activity are taken from description of the read or write cycle of the memory port in the memory model. More complex operations, those that have a combination of read and write activities, will be synthesized from the simple read and write cycle definitions contained in the memory model.

Cycle synthesis uses the following heuristic. Take each read and write activity of the complex operation sequentially and locate the corresponding cycle definition from the memory model. Take the activity of the cycle definition and append it to the cycle being synthesized. After the cycle has been appended ensure that there is a period of rest and inactivity at the end of the cycle. User defined complex cycles in the memory may also be supported. The default action is then use of this cycle definition in preference to the synthesizing it.

Numeric Values

Numeric values given within the present UDA language can be in a variety of bases. The default, with no prefix, is decimal. The alternative is to qualify the number base, using a case insensitive base specifying prefix, with optional bit size preamble and then express the number in that base. The valid number prefixes are 'b (binary). 'o (octal), 'd (decimal), and 'h (hex). The optional size preamble is a decimal number preceding the base that specifies how many bits should be used to represent the number. The number is truncated to this number of bits. For example the following are all ways of describing 35: 'b1000011, 'o43. 'H23, 64'h23 and of course 'd35. However, 3'h23 represents the number 3.

Jump Addressing

Jump addressing, which is used for algorithms such as column march algorithms, results in a BIST controller implementation that uses a number of parallel address counters. As many as are necessary to represent the address sequences need when using the jump address value from the memory model for each model. If all of the memories the BIST controller is testing have a common jump value then a single address counter is used. However if some of them have a different jump value, then multiple address registers are used. This allows the column marching algorithms to access the columns of the memories.

More Data Sources

There are a number of more complex data sources that can be used by the steps of the test algorithm. These include r1; r1ORr2; r1XORr2; and RWr1r2. The first set of three data sources uses the value of a data register or two, as described below. The data source RWr1r2 is more complex. Where the memory access would use non inverted data, after the first write of a RWR operation for example, will use the value of data register 1. When inverted data would be used the value of data register 2 will be used.

Data Registers

It has been described above how data registers can be used to generate the data patterns. These data registers can be initialized as part of a repetition definition. They can also be initialized and manipulated as part of a step definition. A typical repetition and step definition using registers appears as follows:

```
step s1;
    addr end1, end2, direction, increment;
    data RWR1R2;
    ld r2, addr;
    operation RWR;
step s2;
    addr end1, end2, direction, increment;
    data R1XORR2;
    ld r1, addr;
begin
    ld r1, addr;
    rol r2;
    operation RWR;
end
    repetition name;
    seed 0;
    ld r1, seed;
begin
    step s1;
    step s2;
end
```

In this example the repetition initializes the first data register to 0. The first step initializes the second data register with an initial value based on the address unique data pattern for the register. This initialization is only done before the first address. The second step initializes the first data register with the address unique data pattern before the first address and also between each address. Note the use of the begin and end block to denote what is done as initialization and at each address. The second data register is not initialized. It uses what ever value it contains, and it is rotated left between each address of the address sequence. The valid register operations are the following:

ld reg, source. The register is loaded from one of the
        following data sources: addr, invaddr, seed, invseed,
        background or invbackground.

manip reg. The register is manipulated, one of: rol, ror, lsr,
        lsl. For rotation and logical shifts left and right.

In view of the many possible embodiments to which the principles of our invention may be applied, it should be recognized that the illustrated embodiment is only an example of the invention and should not be taken as a limitation on the scope of the invention. Rather, the scope of the invention is defined by the following claims. We therefore claim as our invention all that comes within the scope and spirit of these claims.

We claim:

1. A method for providing an algorithm to a BIST controller that tests memory within a circuit, the method comprising:

reading a description of a user defined test algorithm for a BIST controller;

translating the description into an in-memory representation of the user defined algorithm;

reading a memory model selected by a user;

associating the in-memory representation of the user-defined algorithm with the selected memory model; and generating an HDL description of a BIST controller operable to apply the user defined algorithm to a memory corresponding to the selected memory model.

2. The method of claim 1 wherein the algorithm description comprises a human-readable description.

3. The method of claim 1 wherein the algorithm description comprises a source code file.

4. The method of claim 1 wherein the algorithm description comprises a graphical model.

5. The method of claim 1 wherein an in-memory representation of the user-defined algorithm is associated with multiple memory models.

6. The method of claim 1 wherein in-memory representations of multiple user-defined algorithms are associated with a memory model.

7. The method of claim 1 including wherein in-memory representations of multiple user-defined algorithms are associated with multiple memory models.

8. The method of claim 1 including:

generating an in-memory representation of a standard test algorithm contained within a software tool upon activation of the tool; and associating the in-memory representation of the standard algorithm with the selected memory model.

9. The method of claim 1 including:

in a computer, providing user access to a description of a standard test algorithm;

recording changes made by a user to a copy of the standard test algorithm description; and saving the changed copy as a user defined algorithm description.

10. A computer readable medium on which is stored a software tool that inserts BIST controllers into circuits for testing memory therein, the tool containing instructions for performing the following:

reading a description of a user defined test algorithm for a BIST controller;

translating the description into an in-memory representation of the user defined algorithm;

reading a memory model selected by a user;

associating the in-memory representation of the user-defined algorithm with the selected memory model; and generating an HDL description of a BIST controller operable to apply the user defined algorithm to a memory corresponding to the selected memory model.

11. The computer-readable medium of claim 10 including instructions for:

generating an in-memory representation of a standard test algorithm upon activation of the tool; and associating the in-memory representation of the standard algorithm with the selected memory model.

12. The computer-readable medium of claim 10 including instructions for:

providing user access to a copy of a description within the tool of a standard test algorithm;

recording changes made by a user to the copy; and saving the changed copy as a user defined algorithm description.

13. A method for building a standard test algorithm into a software tool that adds BIST controllers to circuits for testing memory therein, the method comprising:

reading a description of a standard test algorithm for a BIST controller;

translating the description into an in-memory representation of the algorithm;

translating the in-memory representation of the algorithm into source code written in the language of the software tool; and compiling the algorithm source code with the tool source code, thereby producing a software tool with the test algorithm built therein.

14. The method of claim 13 wherein the algorithm description comprises a source code file written in a language different than the language of the tool.

15. The method of claim 13 wherein the algorithm description comprises a graphical model.

16. A computer-readable medium on which is stored a test algorithm to be read by a software tool that adds BIST controllers to circuits for testing memory therein, the algorithm containing instructions defining the following:

one or more steps, a step containing an address clause, a data clause, and an operation clause;

one or more repetitions, a repetition referencing a number of steps; and a root referencing a number of repetitions.

17. The computer-readable medium of claim 16 wherein the address clause of a step contains parameters defining the boundaries of the address space, whether the address space is traversed up or down, and the size of the address increment during traversal of the address space.

18. The computer-readable medium of claim 16 wherein the data clause of a step defines the type of data used during memory accesses of the step.

19. The computer-readable medium of claim 16 wherein the operation clause of a step defines a memory access operation performed at each address accessed during a step.

20. The computer-readable medium of claim 16 wherein a repetition includes a default seed value used by the steps within the repetition.

* * * * *